United States Patent
Zheng

[19]

[11] Patent Number: 5,963,482
[45] Date of Patent: Oct. 5, 1999

[54] MEMORY INTEGRATED CIRCUIT WITH SHARED READ/WRITE LINE

[75] Inventor: Hua Zheng, Fremont, Calif.

[73] Assignee: Winbond Electronics Corp., Taiwan

[21] Appl. No.: 09/115,375

[22] Filed: Jul. 14, 1998

[51] Int. Cl.$^6$ ................................................ G11C 16/04
[52] U.S. Cl. .............................. 365/189.04; 365/189.05; 365/230.08; 365/63
[58] Field of Search ........................ 365/189.04, 189.05, 365/230.08, 233, 239, 63

[56] References Cited

U.S. PATENT DOCUMENTS

| | | | |
|---|---|---|---|
| 5,088,062 | 2/1992 | Shikata .............................. | 365/189.04 |
| 5,367,494 | 11/1994 | Shebanow et al. ................. | 365/189.04 |
| 5,412,613 | 5/1995 | Galbi et al. ........................ | 365/63 |
| 5,640,351 | 6/1997 | Yabe et al. ........................ | 365/230.06 |

*Primary Examiner*—David Nelms
*Assistant Examiner*—Tuan T. Nguyen
*Attorney, Agent, or Firm*—Proskauer Rose LLP

[57] ABSTRACT

A memory device is provided with N>1 memory arrays. Each of the memory arrays comprises a plurality of memory cells arranged into rows and columns. N I/O lines are provided that can be simultaneously activated during a prefetch cycle. Each of the I/O lines is connected to the memory cells of a different one of the N memory arrays for transferring data signals to and from specific addressed ones of the memory cells of the respective memory array. N latches are also provided wherein each of the latches is connected to a different one of the I/O lines. Furthermore, a read/write line is connected to each of the latches and extends along an edge of each memory array. During a prefetch cycle, each of the N I/O lines simultaneously transfers a data signal thereon. Each of the N latches receives a different phase clock signal for synchronizing a transfer of N data signals, including one data signal of each of the latches. The data signals are transferred between the latches and the read/write line so that each data signal is transferred during a respective different $n^{th}$ interval of a transfer cycle, where $1 \leq n \leq N$. As such, N data signals, including one data signal originating at, or destined to, each of the N memory arrays, are transferred sequentially via the read/write line during the prefetch cycle.

4 Claims, 2 Drawing Sheets

MEMORY INTEGRATED CIRCUIT WITH SHARED READ/WRITE LINE

FIELD OF THE INVENTION

The present invention pertains to semiconductor integrated circuit (IC) memories. In particular, the present invention pertains to a synchronous dynamic random access memory (SDRAM) with a reduced spacing requirement.

BACKGROUND OF THE INVENTION

FIG. 1 shows part of a conventional SDRAM 10. As shown, the SDRAM 10 has multiple, i.e., N memory arrays 11 and 12 although only two memory arrays are shown for sake of clarity. As in an ordinary DRAM, the memory cells of each memory array 11 and 12 are arranged into a two-dimensional "super" memory array of rows and columns, of which each memory array 11 and 12 is simply a sub-array (each memory array 11, 12 containing only a subset of the columns of the super memory array). A particular memory cell can be accessed by activating a row line of a row of the accessed memory cell and a column line, or pair of column lines of a column of the accessed memory cell. Herein, each column of cells is assumed to be connected to a pair of column lines without loss of generality. The access can be in the form of a read or write operation, and a row line or pair of column lines can be activated by applying a particular voltage to the line or pair of lines or monitoring a voltage on the particular line or pair of lines. Each memory cell is assigned a unique address which can be divided into a row address portion and a column address portion. The row address portion indicates a particular row line to activate, and the column address portion specifies a particular pair of column lines to activate, when accessing the memory cell.

Like an ordinary DRAM, the SDRAM 10 supports ordinary read and write operations, during which only a single addressed memory cell is accessed at one time. However, the SDRAM 10 also supports a synchronous write operation and a synchronous read operation during which multiple cells in the same row are accessed in rapid succession. A number of different techniques may be employed to effect such successive rapid accesses. See H. J Yoo, *A Study of Pipeline Architectures for High-Speed Synchronous DRAM's*, IEEE J. SOLIDSTATE CIRS., vol. 32, no. 10, October, 1997, page 1597–1603. The particular SDRAM 10 shown in FIG. 1 uses a prefetch technique to effect several accesses in rapid succession. According to a prefetch technique, a single row line, and multiple column lines are simultaneously activated in order to cause multiple memory cells to be accessed simultaneously. In the case of a prefetch read, multiple memory cells, including one memory cell in each bank 11 and 12, simultaneously output the data values that they store onto a respective column line pair 13 or 14. The data values are outputted simultaneously via column selectors 15 and 16 onto a respective I/O line pair 17 or 18. Data sense amplifiers 19 and 20 receive the signals on I/O lines 17 and 18 from the column selectors 15 and 16 and simultaneously output the sensed data signals on the read/write line pairs 21 or 22 corresponding to the memory array 11 or 12, respectively, to which each respective data sense amplifier 19 or 20 is connected. The data values on read/write line pairs 21 or 22 are each simultaneously received at, and simultaneously stored in, a respective latch 23 or 24 to which each read/write line pair 21 or 22 is connected. Each latch 23 or 24 outputs the data value stored therein depending on a respective control or clock signal SFCLK0 or SFCLK1. Illustratively, these control signals have enabling pulses that occur in rapid succession so as to sequentially output the data value in latch 23 followed by the data value in latch 24. This is shown in FIG. 2 for a general case of outputting N total data values from N memory arrays 11 and 12. Each control signal SFCLK0, SFCLK1, . . . SFCLKN−1 is generated in succession during a respective $n^{th}$ ($1 \leq n \leq N$) interval of a transfer cycle having a duration of 1/N of the length of the transfer cycle. The sequentially outputted data values are amplified by driver 25 and then driven onto the DQ pad 26 in succession.

During a prefetch write operation, a sequence of data values are received in rapid succession at DQ pad 26. Each signal of the sequence is amplified by driver 25 and fed to the latches 23 and 24. Control signals SFCLK0 and SFCLK1 are provided with enabling pulses that occur in rapid succession; the enabling pulse of SFCLK0 occurring when the data value of the sequence to be stored in memory array 11 is applied to DQ pad 26 and the enabling pulse of SFCLK1 occurring when the data value of the sequence to be stored in memory array 12 is applied to the DQ pad. Such enabling pulses also occur during corresponding $n^{th}$ intervals of the transfer cycle as shown in FIG. 2. After each data value is stored in its respective latch 23 or 24, the data values are simultaneously outputted via corresponding read/write line pairs 21 or 22 attached to the latch 23 or 24, respectively, through data sense amplifiers 19 or 20, respectively and onto I/O lines 17 or 18, respectively. From there, the corresponding column selector 15 or 16 outputs the data values onto the column line pair 13 or 14 for storage in the appropriate memory array 11 or 12, respectively.

One of the problems with the SDRAM 10 is that the read/write lines 21 and 22 take up a large amount of area on the IC chip, represented in FIG. 1 by the width w and length l. Here, l is approximately equal to the distance from the data sense amplifier of the memory array most distant from the latches 23, 24 to the latches 23 and 24. The length l is a function of the number of memory arrays 11 and 12 and the length of each memory array 11 and 12. Generally speaking, the line spacing (line width and inter-line spacing) requirement is 2 $\mu$m. If there are 32 memory arrays, and two read/write lines (for differential signal transmission) per memory array, then 64 lines with a total width requirement of w=128 $\mu$m is needed. In such a case, the area needed for the read/write lines is 128×l $\mu$m.

It is therefore an object of the present invention to overcome the disadvantages of the prior art.

SUMMARY OF THE INVENTION

This and other objects are achieved by the present invention. According to one embodiment, a memory device is provided with N>1 memory arrays. Each of the memory arrays comprises a plurality of memory cells arranged into rows and columns. N I/O lines are provided that can be simultaneously activated during a prefetch cycle. Each of the I/O lines is connected to the memory cells of a different one of the N memory arrays for transferring data signals to and from specific addressed ones of the memory cells of the respective memory array. N latches are also provided wherein each of the latches is connected to a different one of the I/O lines. Furthermore, a read/write line is connected to each of the latches and extends along an edge of each memory array. During a prefetch cycle, each of the N I/O lines simultaneously transfers a data signal thereon. Each of the N latches receives a different phase clock signal for synchronizing a transfer of N data signals, including one data signal of each of the latches. The data signals are transferred between the latches and the read/write line so that each data signal is transferred during a respective different $n^{th}$ interval of a transfer cycle, where $1 \leq n \leq N$ As such, N data signals, including one data signal originating at, or destined to, each of the N memory arrays, are transferred sequentially via the read/write line during the prefetch cycle.

By moving the latches to the vicinity of their respective memory arrays, a single read/write line or a single pair of read/write lines (if the data signals are transmitted differentially) can be used to rapidly transfer multiple data values during a prefetch read or write cycle. Since substantially fewer read/write lines are needed, a huge savings in layout space is achieved.

BRIEF DESCRITPTION OF THE DRAWINGS

DETAILED DESCRIPTION OF THE INVENTION

Generally speaking, the length of the memory arrays 1 is fixed by the number of memory arrays, columns of memory cells per array and the photolithographic resolution limits of the fabrication process used to form the SDRAM. However, according to the invention, the width w necessary for laying out the needed read/write lines can be reduced through judicious modification of the memory architecture.

Figure 3:
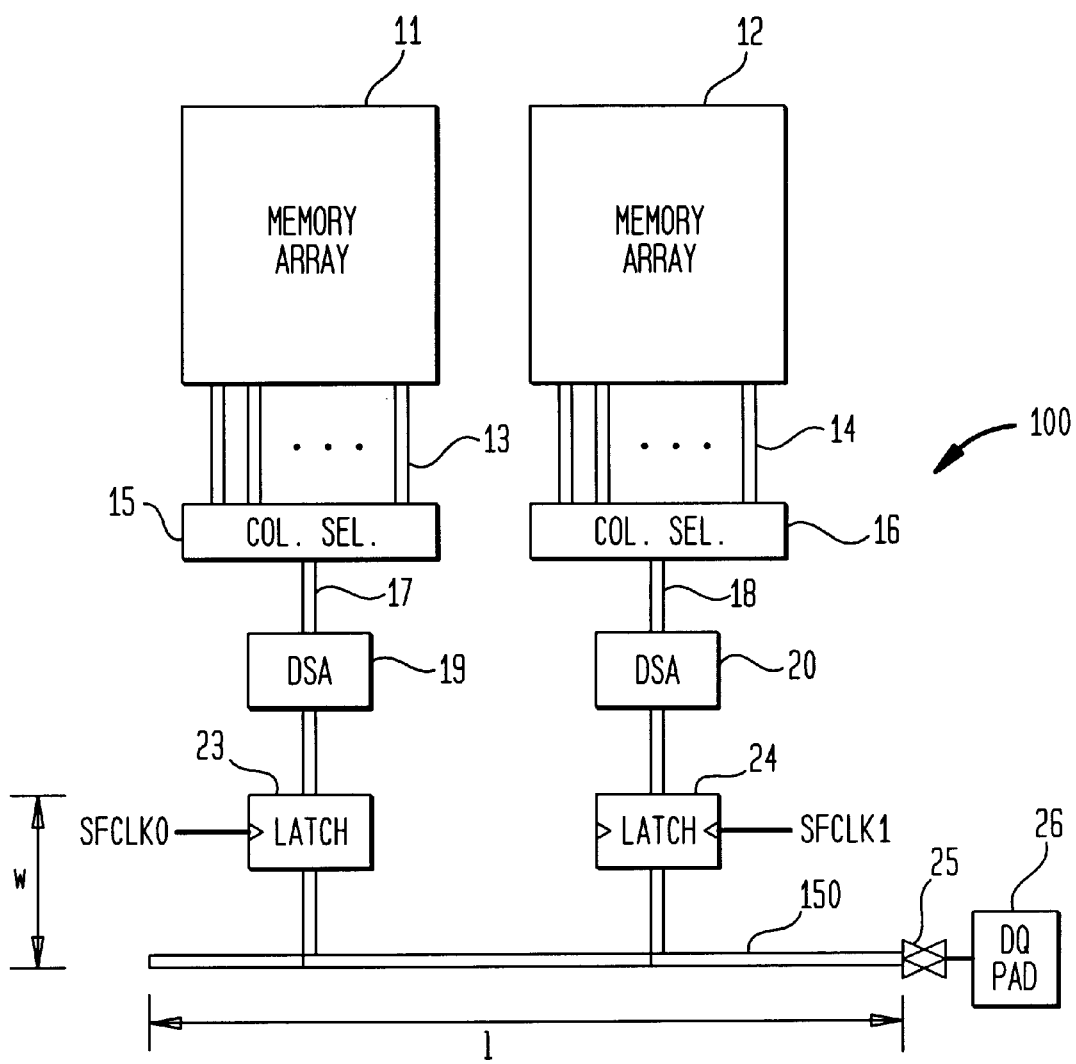
FIG. 3 shows an SDRAM according to an embodiment of the present invention.

Referring to FIG. 3, an SDRAM 100 is shown that is capable of executing a prefetch read or prefetch write operation. As before, the memory architecture includes N arrays 11, 12 of memory cells organized into rows and columns. For sake of clarity, only two memory arrays are shown, although N typically is 16, 32, . . . , etc. depending on the total memory capacity of the SDRAM 100. Column line pairs 13, 14 connected to each pair of columns in the memory array 11 or 12, respectively, are selectively activated by column selectors 15 or 16, respectively. Data values of accessed columns are transferred between the column selector 15 or 16 and a data sense amplifier, 19 or 20, respectively, via a corresponding pair of I/O lines 17 or 18.

According to the invention, the latch corresponding to each memory array, i.e., the latch 23 corresponding to the memory 11 or the latch 24 corresponding to the memory array 12, is placed near its respective memory array 11 or 12. As shown, the latch 23 is placed below the memory array 11 to which it corresponds and is (directly) connected to the data sense amplifier 21. Likewise, the latch 24 is placed below the memory array 12 to which it corresponds and is (directly) connected to the data sense amplifier 22. Each latch 23 or 24 receives a respective control or clock signal SFCLK0, SFCLK1, . . . , SFCLKN−1 with a different phase. Each latch 23 or 24 is furthermore connected to a single read/write line pair 150. The read/write line pair 150 is connected via a driver 25 to the DQ pad 26.

Figure 2:
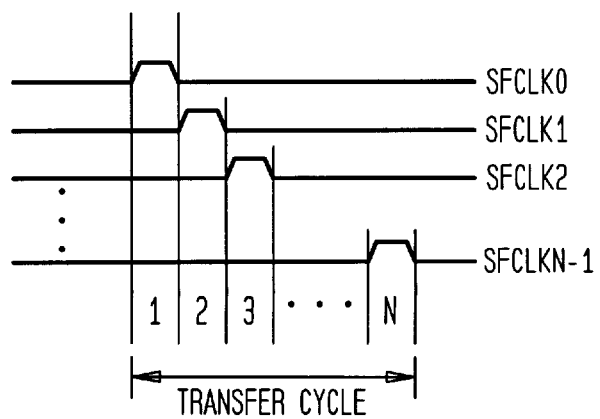
FIG. 2 shows a conventional prefetch transfer timing.

During a prefetch read, a particular row line (not shown) is activated. A signal is provided to each of the N column selectors 15, 16 for simultaneously activating a particular column line pair 13, 14, respectively in each of the N memory arrays 11, 12. As such, one data value is retrieved from each of the N memory arrays 11, 12 and outputted via the selected column line pairs 13, 14 and the column selectors 15, 16 to I/O line pairs 17, 18 corresponding to the respective memory arrays 11, 12. Each data value on the I/O line pairs 17, 18 is amplified by the data sense amplifier 19, 20, respectively connected thereto and outputted to the latch 23 or 24 corresponding to the respective memory array 11, 12. Pulses are supplied in the control or clock signals SFCLK0, SFCLK1, . . . , SFCLKN−1 during sequential 1/N duration intervals numbered of a transfer cycle, as is depicted in FIG. 2. This causes each latch 23, 24 to successively output the data value stored therein on the read/write line pair 150, during a respective no interval of the transfer cycle, where $1 \leq n \leq N$. Advantageously, 1/N is a relatively short duration interval of time in comparison with the normal read time of a conventional DRAM. As such, the data values simultaneously retrieved from the N memory arrays are outputted in rapid succession as a sequence of data values on read/write line pair 150. This is possible because a substantial portion of the access time of an individual cell is consumed in decoding the address, activating the correct row and column and allowing the accessed cell to apply the appropriate voltage levels to the column line pair to which it is attached. However, these operations are performed in parallel for each of N cells. Accordingly, a substantial savings in access time is achieved using the prefetch operation. The driver 25 drives each data value onto the DQ pad 26 thereby outputting the data values in rapid succession.

During a prefetch write operation, a sequence of N data values is applied to the DQ pad 26 in rapid succession, each data value being applied during a respective $n^{th}$ interval ($1 \leq n \leq N$) of a transfer cycle having a duration of 1/N times the length of the transfer cycle. The driver 25 drives each data value onto the read/write line pair 150.

Each latch circuit 23, 24 receives each data value transferred on the read/write line pair. However, the latch circuits are controlled by the control/clock signals SFCLK0, SFCLK1, . . . , SFCLKN−1 so that latch 23, 24 only stores a particular data value destined to the memory array 11 or 12 to which the latch corresponds. That is, the control/clock signal SFCLKn received at each $n^{th}$ latch has a pulse during a respective $n^{th}$ interval of the transfer cycle corresponding to the appearance of the $n^{th}$ data value on the I/O line pair 150. Thus, each latch 23, 24 stores its respective data value of the sequence. The N data values stored in the N latches 23, 24 are then simultaneously transferred to the data sense amplifiers 19, 20, respectively, which amplify the data values. The amplified data values are then simultaneously outputted on the respective I/O line pairs 17, 18 to the corresponding column selectors 15, 16. Each column selector 15 or 16 causes the received data value to be outputted on a selected column line pair 13 or 14 for storage in a memory cell connected thereto in the respective memory array 11 or 12.

Figure 1:
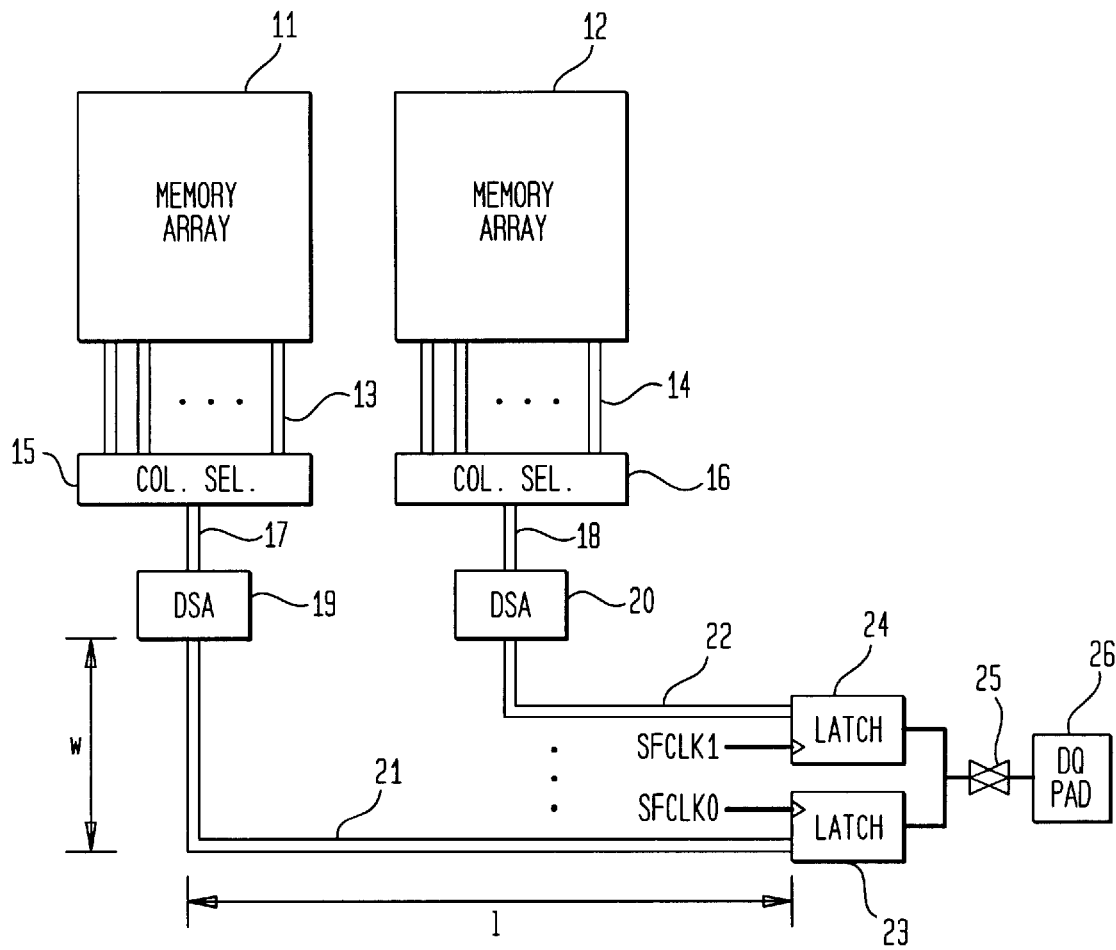
FIG. 1 shows a conventional SDRAM prefetch architecture.

Note that the length 1 occupied by the single read/write line pair 150 and the latches 23 and 24 is approximately the same as the length occupied by the read/write line pairs 21, 22 in FIG. 1. However, the width required for the single pair of read/write lines 150 and the latches 23 and 24 is substantially reduced—only a width of 2 $\mu$m is needed (as the latches 23 and 24 may be formed under the read/write line pair 150). Note also that the width for the read/write line pair 150 does not depend on the number of memory arrays 11, 12 in the SDRAM 100. Thus, the number of memory arrays 11, 12 can be selected relatively independently of the spacing requirement of the read/write line pair 25 needed to achieve a prefetch read or prefetch write operation.

The above discussion is intended to be merely illustrative of the invention. Those having ordinary skill in the art may devise numerous alternative embodiments without departing from the spirit and scope of the following claims.

The claimed invention is:

1. A memory device comprising:

N>1 memory arrays, each of said memory arrays comprising a plurality of memory cells arranged into rows and columns, N I/O lines that can be simultaneously activated during a prefetch cycle, each of said I/O lines corresponding to a different one of said N memory arrays and being connected to said memory cells of said different one of said N memory arrays, said I/O lines transferring data values to and from specific addressed ones of said memory cells of said corresponding memory array, N latches, each of said latches being connected to a different one of said I/O lines, and a read/write line connected to each of said latches, and extending along an edge of said memory arrays, wherein during said prefetch cycle, each of said N I/O lines simultaneously transfers a data value thereon, and wherein each of said N latches receives a different phase clock signal for synchronizing a transfer of N data signals, including one data signal of each of said latches, between said latches and said read/write line so that each of said N data signals is transferred during a respective different $n^{th}$ interval of a transfer cycle, where $1 \leq n \leq N$, so that said N data signals, including one data signal originating at, or destined to, each of said N memory arrays, are transferred sequentially via said read/write line during said prefetch cycle.

2. The memory device of claim 1 further comprising:

N data sense amplifiers, including one data sense amplifier corresponding to, and connected between, each of said latches and a corresponding one of said I/O lines.

3. The memory device of claim 1 wherein during a prefetch read, a memory cell in each of said N memory arrays simultaneously outputs a data value stored therein onto said I/O line corresponding to said memory array, each of said data values outputted on one of said I/O lines being stored in said corresponding latch connected thereto, and wherein each of said latches outputs said data value stored therein during a respective different one of said $n^{th}$ intervals of said transfer cycle onto said read/write line.

4. The memory device of claim 1 wherein during a prefetch write, each data value of a sequence of N data values is transferred during different corresponding $n^{th}$ intervals of said transfer cycle on said read/write line and wherein each of said N latches stores a particular corresponding one of said data values during said respective $n^{th}$ interval, said N latches subsequently simultaneously outputting said respective stored data values onto said corresponding I/O lines for storage in said corresponding memory arrays.

* * * * *